United States Patent
Du et al.

(10) Patent No.: US 10,873,052 B2
(45) Date of Patent: Dec. 22, 2020

(54) MASK PLATE AND THIN-FILM ENCAPSULATION METHOD

(71) Applicant: Wuhan China Star Optoelectronics Semiconductor Display Technology Co., Ltd., Hubei (CN)

(72) Inventors: Xiao Du, Guangdong (CN); Yungsheng Chen, Guangdong (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 301 days.

(21) Appl. No.: 16/084,869

(22) PCT Filed: Feb. 11, 2018

(86) PCT No.: PCT/CN2018/076343
§ 371 (c)(1),
(2) Date: Sep. 13, 2018

(87) PCT Pub. No.: WO2019/100609
PCT Pub. Date: May 31, 2019

(65) Prior Publication Data
US 2020/0303675 A1    Sep. 24, 2020

(30) Foreign Application Priority Data
Nov. 27, 2017  (CN) .......................... 2017 1 1208519

(51) Int. Cl.
*H01L 51/52*    (2006.01)
*C23C 16/04*    (2006.01)
(Continued)

(52) U.S. Cl.
CPC ........ *H01L 51/5253* (2013.01); *C23C 16/042* (2013.01); *H01L 51/0031* (2013.01); *H01L 51/56* (2013.01)

(58) Field of Classification Search
CPC ............. H01L 51/0011; H01L 51/0023; H01L 51/5237; H01L 51/56; H01L 27/3244; H01L 51/5256; C23C 14/042; C23C 14/24
See application file for complete search history.

(56) References Cited

U.S. PATENT DOCUMENTS

| 2016/0141550 A1* | 5/2016 | Fujino ................. H01L 51/5253 257/40 |
| 2017/0141314 A1 | 5/2017 | Moon et al. |
| 2019/0003033 A1* | 1/2019 | Bai ....................... B05C 21/005 |

FOREIGN PATENT DOCUMENTS

| CN | 202120916 U | 1/2012 |
| CN | 104022233 A | 9/2014 |

(Continued)

OTHER PUBLICATIONS

CN105679967A (Machine translation) (Year: 2016).*
(Continued)

*Primary Examiner* — Mohammed R Alam
(74) *Attorney, Agent, or Firm* — Leong C. Lei (57) ABSTRACT

The present invention provides a mask plate, including a shielding region and an opening region. Wherein the shielding region surrounds the opening region, a shape and location of the opening region corresponds to a film forming region and a portion of a bonding region of a sub-pixel such that a thin film encapsulation material which passes the opening region covers the film forming region and the portion of the bonding region of the sub-pixel, and revealing a FPC region and a testing port. Accordingly, the traces of the boning region on the sub-pixel can be covered and (Continued)

protected by the thin film in order to solve the problem that the traces are damaged or broken so that a lighting yield rate is decreased.

9 Claims, 6 Drawing Sheets

(51) Int. Cl.
     *H01L 51/00*           (2006.01)
     *H01L 51/56*           (2006.01)

(56)          References Cited

FOREIGN PATENT DOCUMENTS

| | | |
|---|---|---|
| CN | 104218053 A | 12/2014 |
| CN | 104347673 A | 2/2015 |
| CN | 105679967 A | 6/2016 |

OTHER PUBLICATIONS CN202120916U (Machine translation) (Year: 2012).*
Chinese Office Action issued in corresponding Chinese Application No. 2017112085199, dated Dec. 17, 2019, pp. 1-8, China National Intellectual Property Administration, Beijing, China.

* cited by examiner

MASK PLATE AND THIN-FILM ENCAPSULATION METHOD

CROSS REFERENCE

This application is a national phase of PCT Patent Application No. PCT/CN2018/076343, entitled "MASK PLATE AND THIN-FILM ENCAPSULATION METHOD", filed on Feb. 11, 2018, which claims priority to China Patent Application No. CN 201711208519.9 filed on Nov. 27, 2017, both of which are hereby incorporated in its entireties by reference.

FIELD OF THE INVENTION

The present invention relates to a display technology field, and more particularly to a mask plate and a thin-film encapsulation method.

BACKGROUND OF THE INVENTION

Forming an OLED device on a flexible substrate to manufacture a flexible display device is a hot research direction of current display technology. In the conventional research and process experience indicates that a water oxygen concentration has a great affection to a lift of the OLED. Therefore, in order to perform an effective encapsulation to the OLED, separating water vapor, oxygen from each unction layer in the OLED device can greatly increase the light of the device.

A glass encapsulation technology for a conventional display panel is very hard to realize a flexible requirement. For flexible encapsulation method developed currently, because the thickness of the encapsulation layer is generally about ten micron, comparing to the conventional glass encapsulation, the thickness of the encapsulation layer can greatly decrease so as to be known as a Thin-Film Encapsulation (TFE) technology. Currently, the TFE encapsulation technology which is more popular and the most promising for mass production are called a Barix encapsulation technology (Inorganic-organic multi-layer package) and an ALD technology (Atomic layer deposition package). The principle is to perform an encapsulation through depositing a thin film by a vapor chemical reaction.

Figure 1:
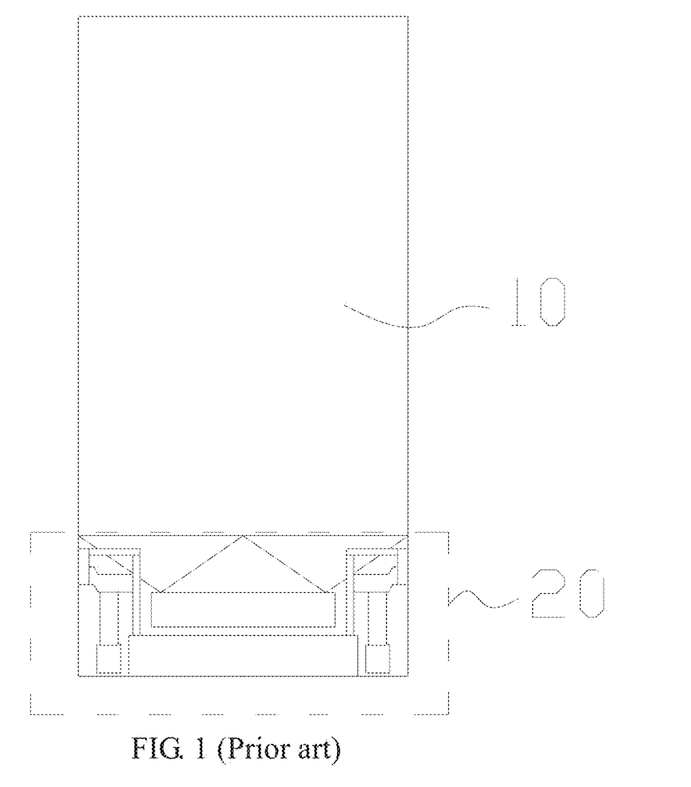
FIG. 1 is a schematic diagram of a sub-pixel in the conventional art.

When applying the above technology to package the substrate, a metal mask plate is required to limit the packaging region to a film forming region (as a region of numeral 10 shown in FIG. 1). Separating a portion of the display panel from a protection layer formed by vapor deposition in order to prevent a panel bonding region from covering by TFE film layer such that a subsequent module process and inspection are failed.

Because the traces distribution of the panel bonding region is finer and fragile, in the manufacturing process of the flexible substrate, the traces are damaged or broken because of scratching, substrate deformation, static electricity or the environment particle so that a subsequent lighting yield rate is decreased.

SUMMARY OF THE INVENTION

The purpose of the present invention is to provide a mask plate in order to solve the problem that the traces are damaged or broken so that a lighting yield rate is decreased.

In order to realize the purpose of the present invention, the present invention provides following solutions:

In a first aspect, a mask plate, comprising: a shielding region and an opening region; wherein the shielding region surrounds the opening region, a shape and location of the opening region corresponds to a film forming region and a portion of a bonding region of a sub-pixel such that a thin film encapsulation material which passes the opening region covers the film forming region and the portion of the bonding region of the sub-pixel, and revealing a flexible printed circuit (FPC) region and a testing port.

In a first possible realization method of the first aspect, the shielding region includes an outer frame and a stopping block extended from a middle portion of a bottom edge of the outer frame to an interior of the opening region such that the opening region forms a first opening and a second opening at two sides of the stopping block, the stopping block is used to mask the FPC region on the sub-pixel.

Combining the first aspect and the first possible realization method of the first aspect, in the second possible realization method of the first aspect, the stopping block is a rectangle, left and right sides at the interior of the shielding region, a top edge, and an extension of an upper edge of the stopping block at the bottom edge commonly form a rectangular region of the opening region, each of the first opening and the second opening is a rectangle and a width of the first opening and a width of the second opening are the same.

Combining the first aspect and the second possible realization method of the first aspect, in the third possible realization method of the first aspect, the left and right edges and the top edge at the interior of the shielding region are offset outwardly with 100~500 µm with respect to a corresponding location of the film forming region of the sub-pixel, a distance between the bottom edge of the interior of the shielding region and an upper edge of the bonding region is 100~500 µm.

Combining the first aspect and the second possible realization method of the first aspect, in the fourth possible realization method of the first aspect, a distance between the upper edge of the stopping block and a lower edge of the bonding region is 100~500 µm.

In the fifth possible realization method of the first aspect, a thickness of the mask plate is 0.01~0.3 mm.

In the sixth possible realization method of the first aspect, the number of the opening regions is above two, and the opening regions are disposed separately.

Combining the first aspect and the sixth possible realization method of the first aspect, in the seventh possible realization method of the first aspect, the opening regions are arranged as a matrix on the mask plate.

The present invention also provides a thin-film encapsulation method, comprising following steps: providing a mask plate, wherein the mask plate includes a shielding region and an opening region, the shielding region surrounds the opening region, a shape and location of the opening region corresponds to a film forming region and a portion of a bonding region of a sub-pixel such that a thin-film encapsulation material which passes through the opening region covers the film forming region and the portion of the bonding region of the sub-pixel, and revealing a flexible printed circuit (FPC) region and a testing port, and entering to a next process point; aligning the mask plate with a glass substrate and moving the mask plate to be close to the glass substrate; inputting a thin-film encapsulation material to pass through the opening region of the mask plate in order to form an encapsulation protection layer on the glass substrate; and separating the mask plate from the glass substrate, inspecting a status of a thin film formed on the glass substrate.

In the first possible realization method of the second aspect, the mask plate is coated with a corrosion protection film in advance.

The beneficial effects of this application: the present invention provides with a mask plate, through disposing a shielding region and an opening region, the shielding region surrounds the opening region, a shape and location of the opening region corresponds to a film forming region and a portion of a bonding region of a sub-pixel such that a thin film encapsulation material which passes the opening region covers the film forming region and the portion of the bonding region of the sub-pixel, and revealing a flexible printed circuit (FPC) region and a testing port. Accordingly, the traces of the boning region on the sub-pixel can be covered by a thin film in order to be protected without affecting the FPC and testing port required in the following process.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

With reference to FIG. 1, one pixel of an OLED display device has three sub-pixels, respectively a red sub-pixel, a green sub-pixel and a blue sub-pixel. FIG. 1 is a schematic diagram of any one sun-pixel. In the manufacturing process of the sub-pixel, depositing a thin film at a film forming region 10 to perform an encapsulation is required and revealing traces at a bonding region 20 in order to perform a next process. The traces insides the bonding region 20 is complex and including FPC (Flexible Printed Circuit) and testing port. In the manufacturing process the FPC, the traces inside the bonding region is easily to be damaged or broken such that a lighting yield rate is decreased.

Figure 2:
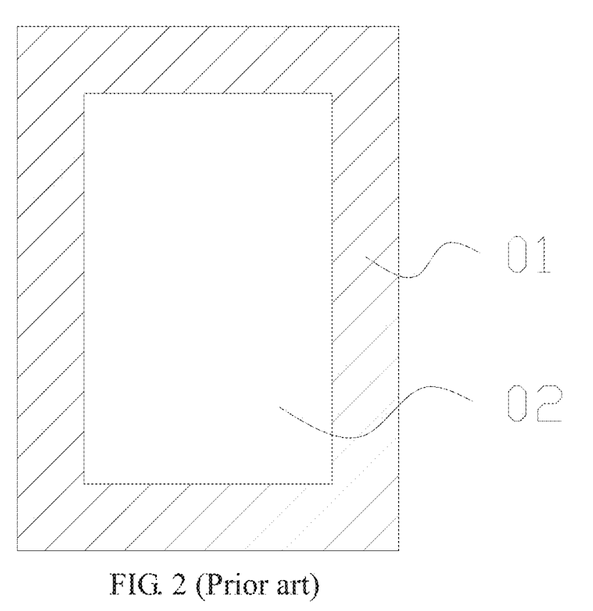
FIG. 2 is a schematic diagram of a mask plate corresponding to the sub-pixel shown in FIG. 1.

With reference to FIG. 2, which is a schematic diagram of a mask plate used in the manufacturing process of the sub-pixel shown in FIG. 1. The mask plate includes a shielding region 01 and an opening region 02. The shielding region 01 is disposed outside the rectangular opening region 02 and surrounds the opening region 02. The shape and the location of the opening region 02 correspond to the film forming region 10. A thin film encapsulation material passes through the opening region 02 to form a protection film on the flexible substrate.

Figure 3:
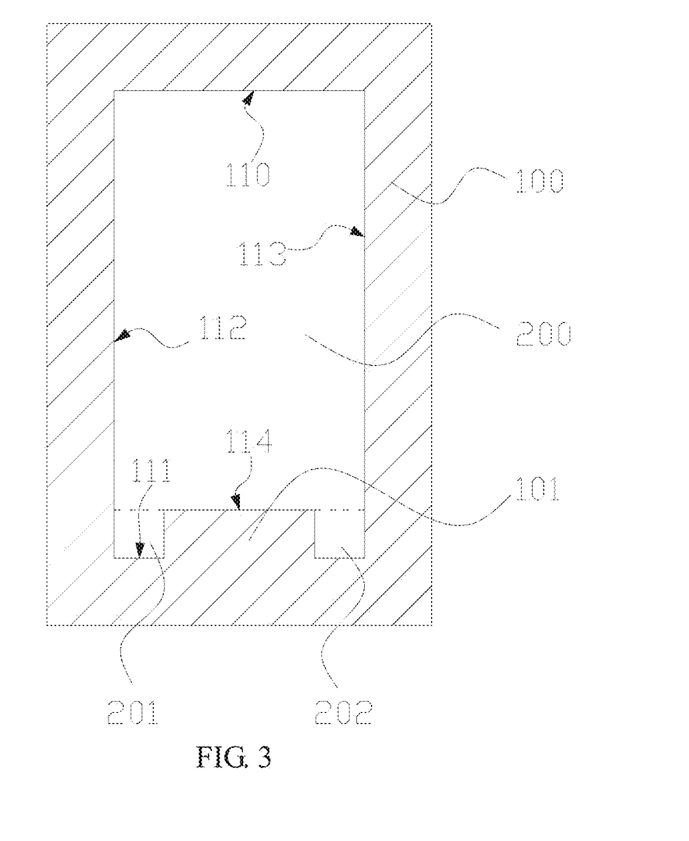
FIG. 3 is a schematic diagram of a mask plate according to an embodiment of the present invention.
Figure 4:
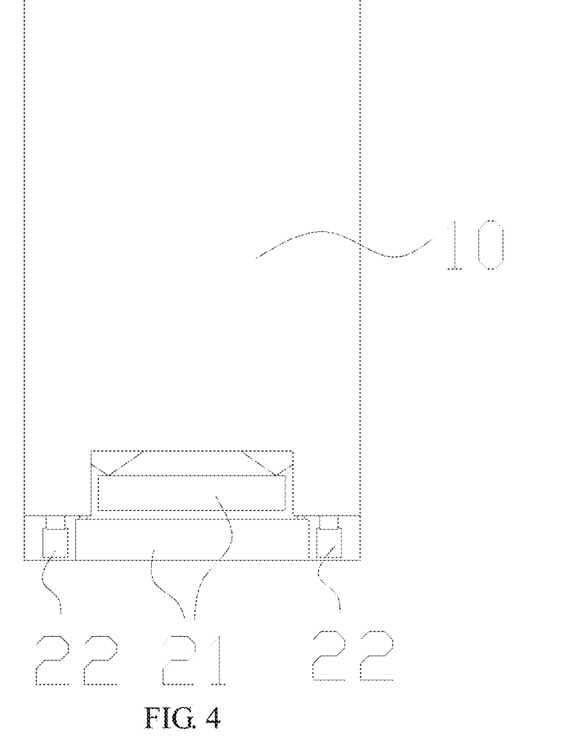
FIG. 4 is a schematic diagram of a sub-pixel manufactured by the mask plate shown in FIG. 3.

With reference to FIG. 3 and FIG. 4, an embodiment of the present invention provides a mask plate including a shielding region 100 and an opening region 200. The shielding region 100 surrounds the opening region 200. A shape and location of the opening region 200 corresponds to a film forming region 10 and a portion of a bonding region 20 of a sub-pixel such that a thin film encapsulation material which passes the opening region 200 covers the film forming region 10 and the portion of the bonding region 20 of the sub-pixel, and revealing a flexible printed circuit (FPC) 21 and a testing port 22.

In the present embodiment, through disposing the opening region 200, and the shape and the location of the opening region 200 correspond to film forming region and the portion of the bonding region 20 of the sub-pixel such that the thin film in the TFE process covers the film forming region 10 and the portion of the bonding region 20, and revealing the FPC 21 and the testing port required in the following process. Accordingly, most of the traces in the boding region is covered and protected so that the traces are not easily to be damaged or broken so as to improve the lighting yield rate.

The mask plate in the present embodiment, not only forming a thin film of the sub-pixel on the substrate, but also providing a protection of the traces of the bonding region on the sub-pixel. The above process can be finished in one TFE process without additional process. The manufacturing process in improved to greatly increase the yield rate of the following process.

In the embodiment of the present invention, the mask plate is a metal mask plate. Preferably, a material of the mask plate is stainless steel or invar. A surface of the mask plate is coated with a corrosion protection film, preferably, an $Al_2O_3$ coating layer or a PTFE coating layer. A coating thickness is 0.1~20 μm in order to prevent the mask plate from damaging in TFE process.

In one embodiment, the shielding region 100 includes an outer frame and a stopping block 101 extended from a middle portion of a bottom edge of the outer frame to an interior of the opening region 200 such that the opening region 200 forms a first opening 201 and a second opening 202 at two sides of the stopping block 101. The stopping block 101 is used to mask the FPC region 21 on the sub-pixel.

Through disposing the stopping block and extending to the interior of the opening region, the FPC region is masked, the film formed on the sub-pixel covers the portion of the bonding region 20 and reveals the FPC region, which will not affect a following process, and protecting the traces of the FPC region 21 better.

In the present embodiment, the bottom edge of the outer frame of the shielding region 100 corresponding to the first opening 201 and the second opening 202 masks the location of the testing port 22 of the bonding region 20 such that the testing port 22 of the sub-pixel is revealed. Accordingly, when the bonding region is protected, using the testing port to perform a lighting test is not affected.

In one embodiment, the stopping block 101 is a rectangle. Left and right edges 112/113 at the interior of the shielding region 100, a top edge 110, and an extension 114 of an upper edge of the stopping block 101 at the bottom edged 111 commonly form a rectangular region of the opening region 200. Each of the first opening 201 and the second opening 202 is a rectangle and a width of the first opening 201 and a width of the second opening 202 are the same. The opening region 200 is formed by the larger rectangular region and the rectangular first opening 201 and the second opening 202 so that a shape that forms by internal four edges of the shielding region 100 and is concave at the location of the stopping block 101. Correspondingly, the four internal edges of the shielding region 100 forms a shape that is convex at the location of the stopping block 101.

In one embodiment, the left and right edges 112/113 and the top edge 110 at the interior of the shielding region 100 are offset outwardly with 100~500 μm with respect to a corresponding location of the film forming region 10 of the sub-pixel, preferably, 200~300 μm, such that the thin film can completely cover the film forming region 10. A distance between the bottom edge 111 of the interior of the shielding region 100 and an upper edge of the bonding region 20 is 100~500 μm, preferably, 200~300 μm, such that the shielding region 100 can mask the testing port 22 and covers traces of the bonding region at the other region. A distance between the upper edge of the stopping block 101 and a lower edge of the bonding region 20 is 100~500 μm, preferably, 200~300 μm such that the stopping block 101 can completely mask the FPC region 21.

In one embodiment, a thickness of the mask plate is 0.01~0.3 mm. Research indicates that a width of the sub-pixel is limited by the thickness of the mask plate. If the thickness of the mask plate is thinner, the width of the sub-pixel is smaller, and PPI is greater. After the experiment, the thickness range of the present embodiment is obtained. Preferably, a thickness range of the mask plate is 0.1~0.2 mm.

Figure 5:
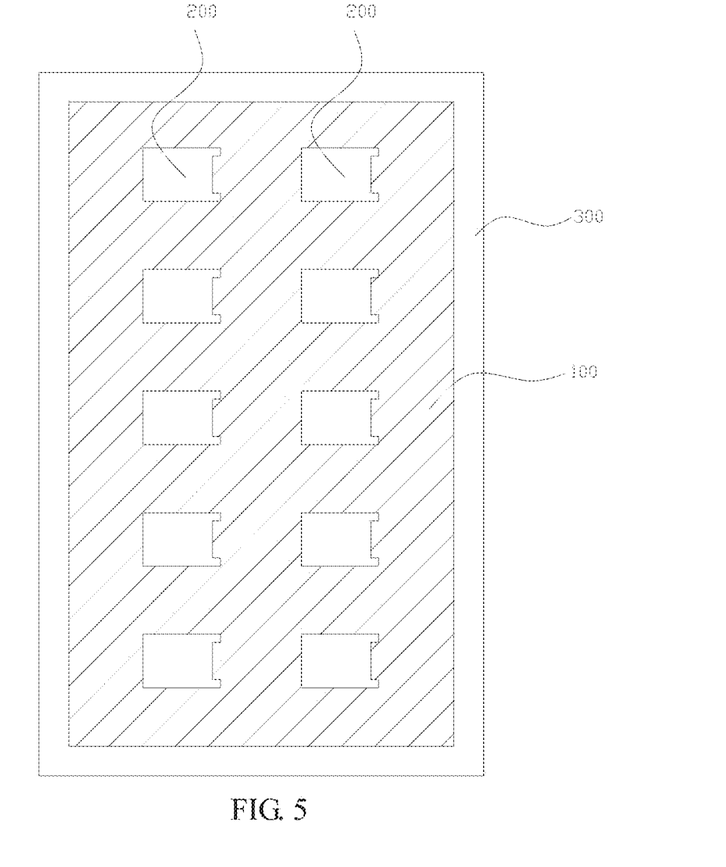
FIG. 5 is a schematic diagram of a mask plate according to an embodiment of the present invention.

In one embodiment, with reference to FIG. 5, the number of the opening regions 200 is above two, and the opening regions 200 are disposed separately In the present embodiment, the mask plate is installed on the supporting frame 300. Specifically, a laser welding technology can be adopted to fix the mask plate at the supporting frame 300. The opening regions 200 are arranged on the mask plate as a matrix. Corresponding to locations of the sub-pixels, opening regions 200 with M rows and N columns are disposed. M×N sub-pixels can be packaged in one TFE process. Wherein the thin film after being packaged covers the film forming layer 10 and the portion of the boding region 20 of each sub-pixel, and revealing FPC 21 and testing port 22 such that traces of the bonding region of each sub-pixel can be protected.

Figure 6:
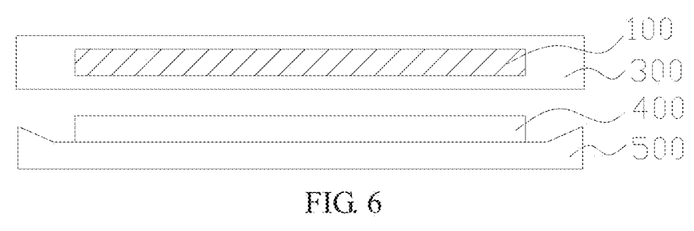
FIG. 6 is a schematic diagram of using state of the mask plate shown in FIG. 5.

With reference to FIG. 3 and FIG. 6, an embodiment of the present invention provides a thin-film encapsulation method, and the method comprises steps of:

Providing a mask plate, the mask plate includes a shielding region 100 and an opening region 200. The shielding region 100 surrounds the opening region 200. A shape and location of the opening region 200 corresponds to a film forming region 10 and a portion of a bonding region 20 of a sub-pixel such that a thin-film encapsulation material which passes through the opening region 200 covers the film forming region 10 and the portion of the bonding region 20 of the sub-pixel, and revealing a flexible printed circuit (FPC) 21 and a testing port 22, entering to a next process point.

Aligning the mask plate with a glass substrate 400 and moving the mask plate to be close to the glass substrate 400;

Inputting a thin-film encapsulation material to pass through the opening region 200 of the mask plate in order to form an encapsulation protection layer on the glass substrate 400;

Separating the mask plate from the glass substrate 400, inspecting a status of a thin film formed on the glass substrate 400.

In the present embodiment, the mask plate is installed on the supporting frame 300. A substrate carrier platform 500 is provided with a CCD or guide pins. When aligning, using the CCD or the guide pins to move the glass substrate 400. Wherein, when the process is finished, the glass substrate 400 is located at a vertical projection of the mask plate 100. The glass substrate 400 is supported by the substrate carrier platform 500.

In the present embodiment, the mask plate and the glass substrate 400 after being aligned enter TFE process. The opening region 200 of the mask plate corresponds to a film forming region 10 and the portion of the bonding region 20 of the sub-pixel of the glass substrate 400. The thin-film formed in the TFE process covers the above region, and reveals FPC 21 and testing port 22 in order to protect traces without affecting a subsequent process.

In one embodiment, the mask plate is coated with a corrosion protection film (not shown) in advance, then, entering to a next process. The corrosion protection film preferably is $Al_2O_3$ or PTFE coating layer, a coating thickness is 0.1~20 μm.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A mask plate, comprising:
a shielding region and an opening region;
wherein the shielding region surrounds the opening region, a shape and location of the opening region corresponds to a film forming region and a portion of a bonding region of a sub-pixel such that a thin film encapsulation material which passes the opening region covers the film forming region and the portion of the bonding region of the sub-pixel, and revealing a flexible printed circuit (FPC) region and a testing port;
wherein the shielding region of the mask plate includes an outer frame and a stopping block extended from a middle portion of a bottom edge of the outer frame to an interior of the opening region of the mask plate and the opening region of the mask plate comprises a primary open space corresponding to the film forming region and secondary open spaces extending from and in communication with the primary open space to respectively define a first opening and a second opening at two sides of the stopping block to expose the portion of the bonding region of the sub-pixel, wherein the stopping block masks the FPC region on the sub-pixel.

2. The mask plate according to claim 1, wherein the stopping block is a rectangle, left and right sides at the interior of the shielding region, a top edge, and an extension of an upper edge of the stopping block at the bottom edge commonly form a rectangular region of the opening region, each of the first opening and the second opening is a rectangle and a width of the first opening and a width of the second opening are the same.

3. The mask plate according to claim 2, wherein the left and right edges and the top edge at the interior of the shielding region are offset outwardly with 100~500 µm with respect to a corresponding location of the film forming region of the sub-pixel, a distance between the bottom edge of the interior of the shielding region and an upper edge of the bonding region is 100~500 µm.

4. The mask plate according to claim 2, wherein a distance between the upper edge of the stopping block and a lower edge of the bonding region is 100~500 µm.

5. The mask plate according to claim 1, wherein a thickness of the mask plate is 0.01~0.3 mm.

6. The mask plate according to claim 1, wherein the number of the opening regions is above two, and the opening regions are disposed separately.

7. The mask plate according to claim 6, wherein the opening regions are arranged as a matrix on the mask plate.

8. A thin-film encapsulation method, comprising following steps:

provide a mask plate, wherein the mask plate includes a shielding region and an opening region, the shielding region surrounds the opening region, a shape and location of the opening region corresponds to a film forming region and a portion of a bonding region of a sub-pixel;

aligning the mask plate with a glass substrate on which the sub-pixel provided and moving the mask plate to be close to the glass substrate;

inputting a thin-film encapsulation material to pass through the opening region of the mask plate in order to form an encapsulation protection layer on the glass substrate, wherein the thin-film encapsulation material which passes through the opening region covers the film forming region and the portion of the bonding region of the sub-pixel to which the opening region corresponds, such that a flexible printed circuit (FPC) region and a testing port of the sub-pixel are not covered by the thin-film encapsulation material and are thus exposed; and separating the mask plate from the glass substrate, and inspecting a status of a thin film formed on the glass substrate;

wherein the shielding region of the mask plate includes an outer frame and a stopping block extended from a middle portion of a bottom edge of the outer frame to an interior of the opening region of the mask plate and the opening region of the mask plate comprises a primary open space corresponding to the film forming region and secondary open spaces extending from and in communication with the primary open space to respectively define a first opening and a second opening at two sides of the stopping block to expose the portion of the bonding region of the sub-pixel, wherein the stopping block masks the FPC region on the sub-pixel.

9. The thin-film encapsulation method according to claim 8, wherein the mask plate is coated with a corrosion protection film in advance.

* * * * *